United States Patent
Seo et al.

[11] Patent Number: 6,146,810
[45] Date of Patent: Nov. 14, 2000

[54] RESIST POLYMER AND CHEMICAL AMPLIFIED RESIST COMPOSITION CONTAINING THE SAME

[75] Inventors: Dong-Chul Seo; Sun-Yi Park; Joo-Hyeon Park; Seong-Ju Kim, all of Taejeon, Rep. of Korea

[73] Assignee: Korea Kumho Petrochemical Co., Ltd., Seoul, Rep. of Korea

[21] Appl. No.: 09/337,438

[22] Filed: Jun. 21, 1999

[30] Foreign Application Priority Data

Sep. 23, 1998 [KR] Rep. of Korea ............... 98-39371

[51] Int. Cl.$^7$ ............... G03F 7/004; C08F 10/00
[52] U.S. Cl. ............... 430/270.1; 430/914; 430/921; 526/281; 526/272
[58] Field of Search ............... 430/270.1, 914, 430/921; 526/281, 272

[56] References Cited

U.S. PATENT DOCUMENTS 5,843,624  12/1998  Houlihan et al. ............... 430/296
6,048,664   4/2000  Houlihan et al. ............... 430/270.1

FOREIGN PATENT DOCUMENTS 2332679   6/1999   United Kingdom .

OTHER PUBLICATIONS

Alicyclic Polymers for 193nm Resist Applications, Okoroanyanwu, U. et al., Chem. Mater. Oct. 1998, 3319–3327.

Primary Examiner—Janet Baxter
Assistant Examiner—Rosemary Ashton
Attorney, Agent, or Firm—Harrison & Egbert

[57] ABSTRACT

A copolymer represented by the formula I and a chemical amplification resist containing the copolymer, which can be easily controlled in sensitivity by regulating the content and kind of the norbornene derivatives in the matrix polymers in addition to being superior in adherence to substrate and dry etch resistance:

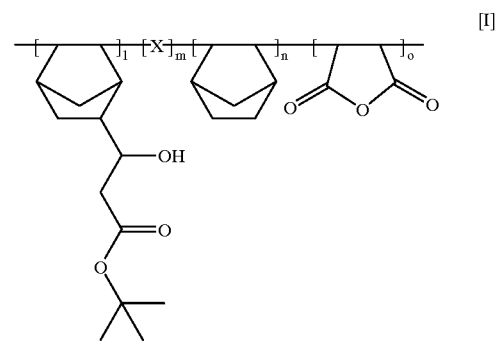

wherein, X is selected from the group consisting of the following general formulas II, III and IV; and, l, m, n and o each are a repeating number not more than 0.5, satisfying the condition that l+m+n+o=1 and $0.4 \leq o \leq 0.5$:

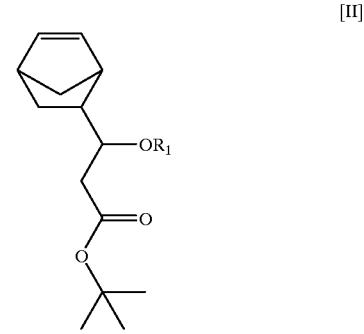

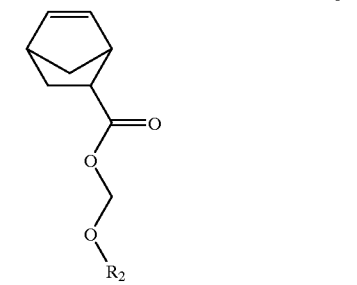

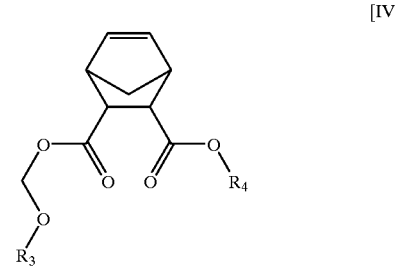

5 Claims, No Drawings

RESIST POLYMER AND CHEMICAL AMPLIFIED RESIST COMPOSITION CONTAINING THE SAME

BACKGROUND OF THE INVENTION

1. Field of the Invention

The present invention relates to a chemical amplification resist copolymer and a resist composition containing it. More particularly, the present invention relates to a photoresist copolymer, which is useful as a matrix resin to form micro patterns, and a chemical amplification resist composition based on the copolymer, which makes it possible to perform a sub-micro lithography process using a deep UV such as a KrF excimer laser or an ArF excimer laser, an X ray such as synchrotron radiation, or charged particle beams such as electron beams.

2. Description of the Prior Art

Certainly, the recent thrust into the high integration of semiconductor devices is greatly based on advances in microlithography. For example, ultra-fine patterns as small as sub-microns, e.g. 0.2 microns or less, in size, are required for the fabrication of ultra-LSI. Now, the light sources used to form the fine patterns become increasingly shorter in wavelength, for example, from g-line or i-line, to deep UV light, including KrF excimer lasers and ArF excimer lasers, further to X-rays, and finally to electron beams.

With near UV light, such as g-line or i-line, which is used in conventional lithography, micro patterns as small as quarter microns (0.25 microns) are virtually impossible to realize. Such a micro pattern requires shorter wavelengths which belong to deep UV excimer lasers, X rays, and electron beams. Of them, KrF and ArF excimer lasers occupied the attention of the researchers in expressing such exquisiteness, and were developed as a light source, requiring novel photoresists. Now, chemical amplification photoresists are prevalently used for deep UV light.

A chemical amplification resist composition suitable for deep UV light fundamentally comprises a polymer with an acid-dissociable functional group, a compound which generates an acid (hereinafter referred to as "photoacid generator"), and a solvent, and avails itself of chemical amplification effect in lithography.

Most of the chemical amplification resists used for KrF excimer lasers are based on phenolic resins which, however, are found to be unsuitable for utilizing an ArF excimer laser because their aromatic rings absorb the light.

As an alternative, polyacrylate derivatives appeared to avoid such absorption. Polyacrylate derivatives show little absorbance at 193 nm, but suffer from a great disadvantage in that they are far inferior in dry etch resistance. Recently, much effort has been made to overcome the disadvantage, including the introduction of alicyclic derivatives into polyacrylate. The introduction of alicyclic derivatives certainly brings about an improvement in dry etch resistance, but causes a significant problem in a developing process because their hydrophobicity has a negative influence on the affinity for developing solutions.

It is known that copolymers of maleic anhydride and olefin can be used as matrix resins which show not only hydrophilicity, but also etch resistance. In the copolymers, maleic anhydride, responsible for hydrophilicity, serves as a promoter which enables the copolymerization with olefinic monomers to be accomplished at low temperatures at low pressures.

SUMMARY OF THE INVENTION

With the background in mind, the present inventors repeated research intensively and thoroughly, aiming to develop a base resin for photoresist, and resulted in the finding that hydroxy-containing norbornene derivative monomers and maleic anhydride monomers give a great contribution to their polymers in improving adherence to substrate, transparency to deep UV light, and dry etch resistance as well as photosensitivity, resolution and developability.

Therefore, it is an object of the present invention to provide a copolymer as a base resin for photoresist, with which there can be obtained patterns as fine as 0.2 μm.

It is another object of the present invention to provide a chemical amplification positive photoresist composition containing the resin.

DETAILED DESCRIPTION OF THE INVENTION

In order to obtain patterns as fine as 0.2 microns by use of light as short in wavelength as ArF excimer laser, new chemical amplification resists have been being actively developed because previous ones did not give desirable patterns. For example, polyhydroxystyrene-based resists show a large absorbance at the wavelength of the light source (193 nm).

In forming 0.2 micron or less patterns, the adherence of a resist composition to a substrate plays an important role. Carboxylic acid was introduced into the side chains of matrix polymers for the purpose of increasing the adherence. Carboxylic acid-grafted matrix polymers, however, require a change in the basicity of developing solutions because the existence of carboxylic acid alters the solubility of the matrix polymers in the aqueous alkaline solutions.

In the polymer according to the present invention, a hydroxy-containing norbornene derivative is introduced into its main chain with the aim of controlling the adherence to substrates and the solubility in aqueous alkaline solutions while a cyclic group exists as a member of its main chain to enhance dry etch resistance.

Accordingly, the present invention provides a polymer for chemical amplification resist, having a repeating unit which comprises a norbornene moiety and a maleic anhydride moiety, and a chemical amplification resist composition based on the polymer.

More details are given of the present invention, below.

POLYMER

The polymer useful in the present invention has a repeat unit consisting of a norbornene, norbornene derivatives and a maleic anhydride. The polymer itself is insoluble or hard-soluble in aqueous alkaline solutions and contains at least one protecting group which can be dissociated by acid.

The alkali solubility of the polymer is primarily dependent on the content of the acid functional groups which are dissociable by acid. Accordingly, the resist properties of the polymer, including adherence to substrate, photo-sensitivity, resolution and the like, can be determined by the kind and quantity of the norbornene derivatives used in the polymer.

The polymer of the present invention is a multi-membered copolymer represented by the following general formula I:

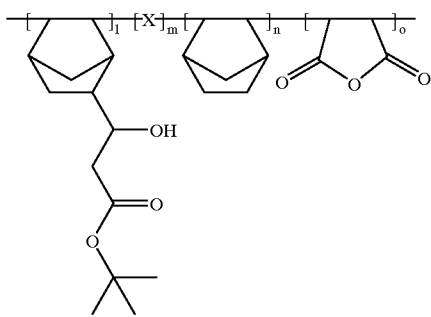

wherein,
X is selected from the group consisting of the following general formulas II, III and IV:

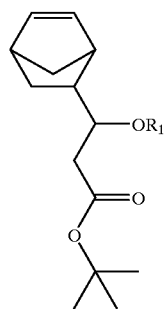

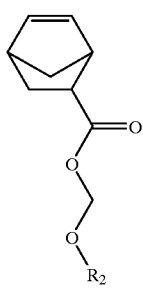

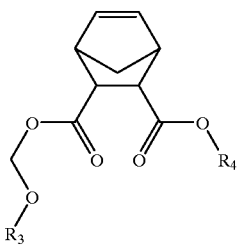

wherein $R_1$ is selected from the group consisting of straight or branched alkyl groups, cyclic or polycyclic alkyl groups, alkyl carbonyl groups, branched alkyl carbonyl groups, and cyclic or polycyclic alkyl carbonyl groups, all containing 1–10 carbon atoms, which are exemplified by acetyl, t-butyl oxycarbonyl, cyclohexane carbonyl, adamantane carbonyl, bicyclo[2,2,1]heptane methyl carbonyl and the like; $R_2$, $R_3$ and $R_4$ are independently selected from the group consisting of straight or branched alkyl groups, and cyclic or polycyclic alkyl groups, all containing 1–10 carbon atoms, which are exemplified by methyl, ethyl, t-butyl, iso-propyl, adamantyl, bicyclo[2,2,1]heptane methyl and the like; and l, m, n and o each are a repeating number not more than 0.5, satisfying the condition that l+m+n+o=1 and 0.4≦o≦0.5. The resist properties, such as adherence to substrate, photosensitivity and resolution, are taken into account in determining the repeating numbers, l, m and n.

When the X moiety reveals itself in the general formula I, the repeat unit of the polymer is represented by the following general formulas V, VI and VII:

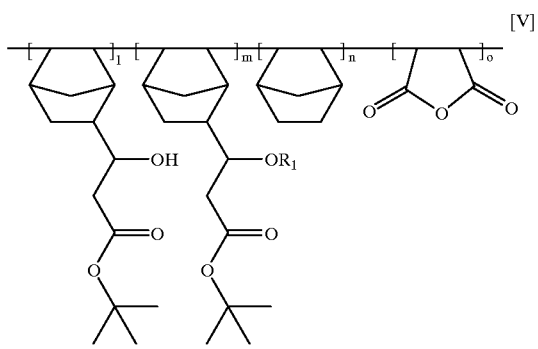

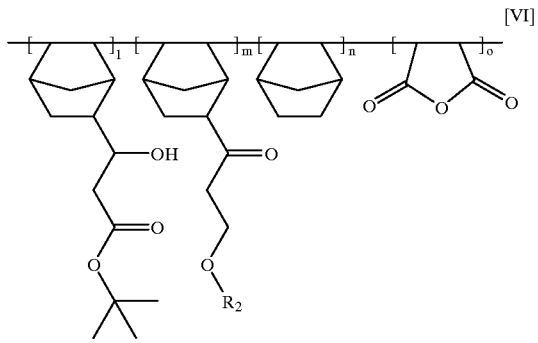

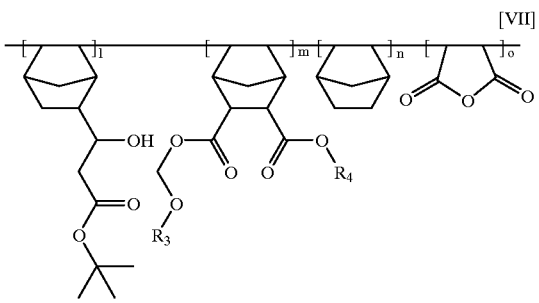

The repeating unit of the Formula I can be prepared by polymerizing an acid-dissociable functional group containing norbornene derivatives selected from the general formulas II, III and IV, a maleic anhydride represented by the following structural formula VIII, a norbornene of the following structural formula IX, and 3-bicyclo[2,2,1]hept-5-en-2-yl-3-hydroxy-propionic acid t-butyl ester (hereinafter referred to as "BHP") represented by the following structural formula X, in the presence of a polymerization catalyst.

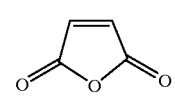

-continued

  [IX]

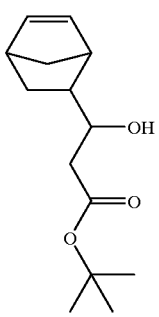  [X]

Account must be taken of the adherence to substrate when determining the amount of the BHP monomer represented by the structural formula X.

These multi-membered polymers may be in the form of a block copolymer, a random copolymer or a graft copolymer. They may be prepared in conventional polymerization processes and, preferably by the action of a radical initiator. For this radical polymerization, an available initiator may be azobisisobutyronitrile (AIBN), benzoyl peroxide (BPO), lauryl peroxide, azobisisocapronitrile, azobisisovaleronitrile, or t-butylhydroperoxide, but is not specifically limited to them. The polymerization of the monomers may be carried out in a manner of bulk polymerization, solution polymerization, suspension polymerization, bulk-suspension polymerization or emulsion polymerization. Examples of useful polymerization solvents include benzene, toluene, xylene, halogenobenzene, diethylether, tetrahydrofuran, acetates, esters, lactones, ketones, amides and mixtures thereof.

The temperature of the polymerization is dependent on the polymerization catalyst employed. For example, if azobisisobutyronitrile is used as a polymerization catalyst, the polymerization is preferably carried out at a temperature of about 60–90° C.

As for the molecular weight of the polymer prepared, it can be controlled by varying the amount of the polymerization initiator and the period of polymerization time. After completion of the polymerization, the monomer residues which remain unreacted in the reaction mixture, and by-products are preferably removed by solvent precipitation. The polymer of the Formula I preferably has a polystyrene-reduced average molecular weight (hereinafter abbreviated to "$M_w$") ranging from about 1,000 to 100,000 as measured by gel permeation chromatography (GPC) and more preferably from about 3,000 to 50,000 when taking into account the sensitivity, developability, coatability and thermal resistance which are required for a photoresist. For example, if the polymer has an $M_w$ of less than 1,000, the resulting photoresist composition is very poor in coatability and developability. On the other hand, if the Mw exceeds 100,000, degradation occurs in sensitivity, resolution and developability. In molecular weight distribution (Mw/Mn), the polymer of the invention preferably ranges from 1.0 to 5.0 and more preferably from 1.0 to 2.0.

As mentioned above, the molecular weights and molecular weight distributions of the polymers obtained were measured by use of GPC in the model HLC-8020 manufactured by TOSHO, equipped with columns G2000HXL, G3000HXL and G4000HXL, eluting tetrahydrofuran at a flow rate of 1.0 ml/min at a column temperature of 40° C. with a standard of mono-dispersed polystyrene.

In the present invention, only one or a mixture of the polymers obtained may be used for the resist.

PHOTOACID GENERATOR

Photoresist patterns as fine as 0.2 microns can be usefully formed by use of the polymers of the present invention. Therefore, the present invention also pertains to a chemical amplification photoresist composition comprising the polymer and a photoacid generator.

As the photoacid generator useful in the present invention, an onium salt, such as iodonium, sulfonium, phosphonium, diazonium and pyridonium, will suffice. Concrete, particularly effective, but non-limitative examples of the onium salt include triphenylsulfonium triflate, diphenyl(4-methylphenyl)sulfonium triflate, diphenyl(4-t-butylphenyl)sulfonium triflate, diphenyl(4-methoxyphenyl) sulfonium triflate, dibutyl(naphthalen-1-yl) sulfonium triflate, triphenylsulonium hexafluoroantimonate, diphenyliodonium triflate, diphenyliodonium methylbenzenesulfonate, bis(cyclohexylsulonyl) diazomethane, and bis(2,4-dimethylphenylsulfonyl) diazomethane. A halogen compound also can be used as the photoacid generator, which is exemplified by 1,1-bis(4-chlorophenyl)-2,2,2-tricholorethane, phenyl-bis(trichloromethyl)-s-triazine or naphthyl-bis(trichloromethyl)-s-triazine. Besides, diazoketone compounds, such as 1,3-diketo-2-diazo, diazobenzoquinone and diazonaphthoquinone, sulfonic compounds, sulfonic acid compounds, and nitrobenzyl compounds may be candidates for the photoacid generator. More preferable are the onium compounds and the diazoketone compounds. The photoacid generators may be used, singly or in combinations.

In contrast to common photoacid generators, the onium salts represented by the following general formulas XI and XII not only serve as dissolution preventers in unexposed areas, but act to promote dissolution in exposed areas:

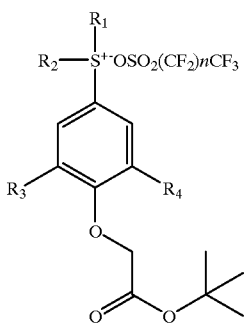  [XI]

-continued

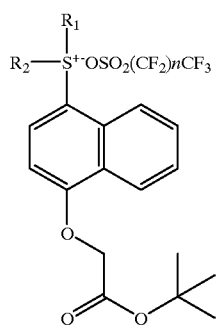
[XII]

wherein $R_1$ and $R_2$, which may be the same or different, each represents an alkyl, an allyl or an aryl; $R_3$ and $R_4$ which may be the same or different, each represents a hydrogen atom, an alkyl or an alkoxy; and n is an integer of 0–14.

The photoacid generators are used at an amount of approximately 0.1–30 parts by weight based on 100 parts by weight of the solid content of the photoresist composition, and preferably at an amount of 0.3–10 parts by weight. They may be used alone or in mixture of at least two species.

In the present invention, if necessary, there may be used a compound which is decomposed by acid to promote the dissolution of the photoresist in a developing solution. As such an acid-decomposable and dissolution-promoting function group, t-butyl ester is most suitable. Therefore, alicyclic derivatives containing t-butyl ester may be recruited in the present invention. Upon formulation, they may be added at an amount of approximately 3–60 parts by weight based on 100 parts by weight of the solid content of the photoresist composition, and preferably approximately 5–40 parts by weight.

Optionally, the photoresist composition of the present invention may comprise additives, such as a surfactant, an azo compound, a halation inhibitor, an adhesive aid, a preservation stabilizer, an antifoaming agent and the like. As for surfactant, it may be exemplified by polyoxylauryl ether, polyoxystearyl ether, polyoxyethylene oleyl ether, polyethyleneglycol dilaurylate, etc. The surfactant is preferably used at an amount of 2 parts by weight or less based on 100 parts by weight of the solid content of the photoresist composition.

When being exposed to light, the photoacid generator, as implied in its name, generates acid. Because the acid plays a great role in determining the sensitivity of the photoresist, it is needed to prevent its diffusing. For this purpose, a base additive may be used. Useful are amine or ammonium compounds. It is preferable that the base compound is used at an amount of approximately 0.01–5 parts by weight based on the total solid content. For example, if the base compound is added at an amount more than the upper limit, the diffusion of the acid is reduced, but the sensitivity is lowered.

To obtain a uniform and flat photoresist coating, the solvent used is required to show an appropriate evaporation rate and viscosity. Examples of such a solvent include ethyleneglycol monomethyl ether, ethyleneglycol monoethyl ether, ethyleneglycol monopropyl ether, methylcellosolve acetate, ethylcellosolve acetate, propyleneglycol monomethyl ether acetate, propyleneglycol monoethyl ether acetate, propyleneglycol monopropyl ether acetate, methylethyl ketone, cyclohexanone, methyl 2-hydroxypropionate, ethyl 2-hydroxypropionate, 2-heptanone, ethyl lactate, and gamma-butyrolacetone. They, if necessary, may be used, alone or in combinations. Depending on its physical properties, such as volatility and viscosity, the solvent is used at such an appropriate amount that a uniform and flat photoresist coating could be formed on a wafer.

A photoresist film is typically obtained by coating the photoresist solution on a wafer and drying it. After being filtered, the photoresist solution may be coated by use of a spin coating, flow coating or roll coating technique.

Then, selective irradiation on the photoresist film coated is performed to give fine patterns. The available radiation, although it is not specifically limited, may be UV light, such as I-line, deep UV light, such as KrF or ArF excimer lasers, X rays, or charged particle beams, such as electron beams, depending on the photoacid generator used. Following the radiation, a thermal treatment may be optionally done to improve the sensitivity of the film.

Generally, the formation of photoresist pattern is finally completed in a developing solution. Examples of the developing solution include aqueous solutions of sodium hydroxide, potassium hydroxide, sodium carbonate, sodium silicate, sodium metasilicate, ammonia water, ethyl amine, n-propyl amine, triethyl amine, tetramethylammonium hydroxide and tetraethylammonium hydroxide with particular preference to tetramethylammonium hydroxide. If necessary, additives, such as surfactants and aqueous alcohols, may be added.

A better understanding of the present invention may be obtained in light of the following examples which are set forth to illustrate, but are not to be construed to limit the present invention.

SYNTHESIS OF MONOMERS

SYNTHESIS EXAMPLE I

In a four-necked flask equipped with a stirrer and a reflux condenser were placed 50 g of a Zn-Cu couple and 90 ml of tetrahydrofuran, followed by slowly charging a solution of 53 ml of t-butyl bromoacetate and 36 ml of 5-norbornen-2-carboxyaldehyde in 180 ml of tetrahydrofuran. After completion of the charging, the solution was subjected to reflux at 70° C. for 2 hours and then, cooled to room temperature. The Zn-Cu couple was filtered off, after which the solution was washed and extracted with the same solvent and distilled under vacuum to give 39 g of 3-bicyclo[2,2,1]hept-5-en-2-yl-3-hydroxy-propionic acid t-butyl ester (BHP) monomer, represented by the following structural formula M-I.

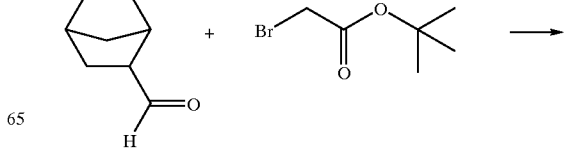

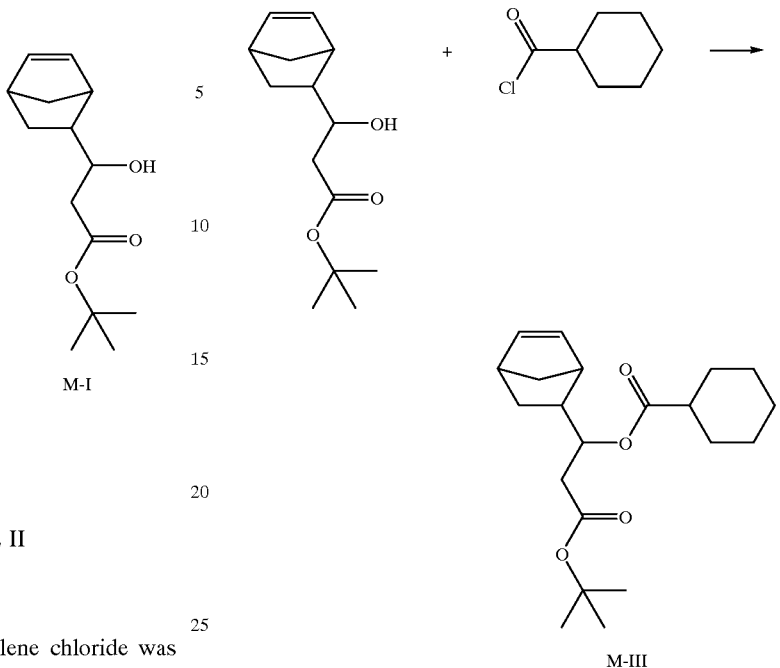

M-I

SYNTHESIS EXAMPLE II

A solution of 50 g of BHP in methylene chloride was added with 20 g of acetyl chloride at 0° C. and then, slowly with 32 g of triethyl amine. While the triethyl amine served as a reaction catalyst, the solution was allowed to react by stirring for 1 hour at the same temperature, and the solvent was removed by vacuum distillation. The reaction mixture diluted in ether was washed with an aqueous sodium carbonate solution and then with brine. The organic layer thus formed was isolated and dried over magnesium sulfate, and the complete removal of the solvent yielded 57 g of the monomer represented by the following structural formula M-II.

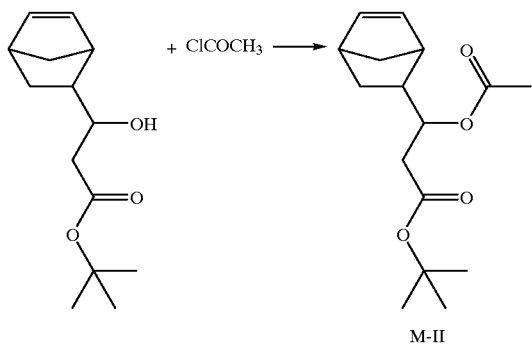

M-II

SYNTHESIS EXAMPLE III

The procedure of Synthesis Example II was repeated using 37 g of cyclohexanecarbonyl chloride instead of 20 g of acetyl chloride, to allow 66 g of the monomer represented by the following structural formula M-III.

M-III

SYNTHESIS EXAMPLE IV 30 g of norbornene carboxylic acid dissolved in methylene chloride were cooled to 0° C. and added with 21 g of chloromethyl methyl ether and then, added slowly with 28 g of triethyl amine. In the presence of this basic catalyst, the reactants were allowed to react by stirring for 1 hour at the same temperature, and the solvent was removed by vacuum distillation. The reaction mixture diluted in ether was washed with an aqueous sodium carbonate solution and then with brine. The organic layer thus formed was isolated and dried over magnesium sulfate, and the complete removal of the solvent yielded 35 g of the monomer represented by the following structural formula M-IV.

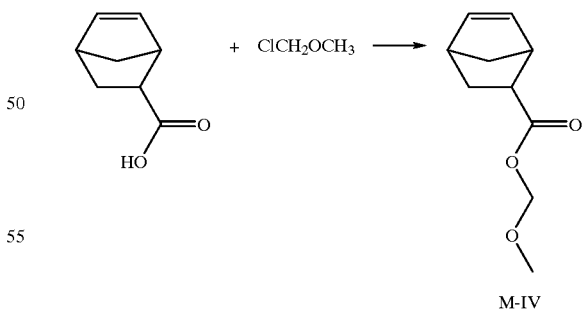

M-IV

SYNTHESIS EXAMPLE V

The procedure of Synthesis Example IV was repeated using 24 g of chloromethyl ethyl ether, instead of 21 g of chloromethyl methyl ether, to obtain 40 g of the monomer represented by the following formula M-V.

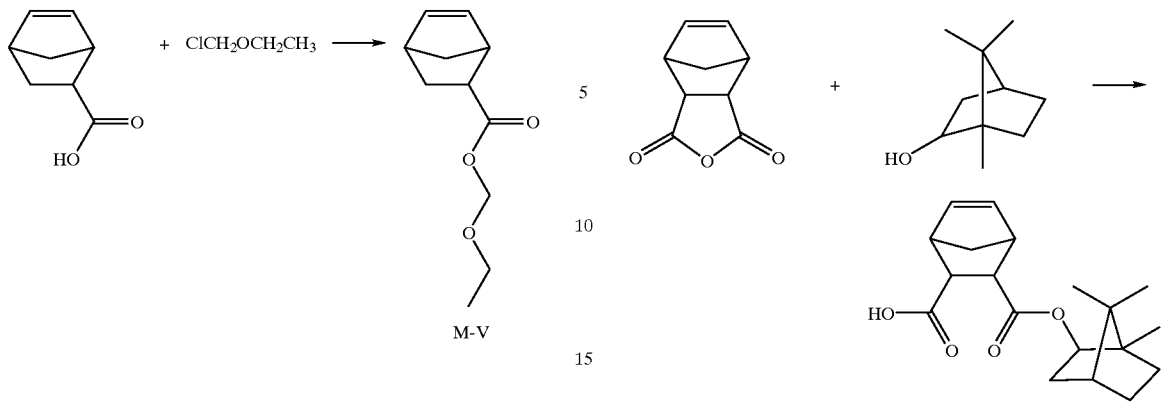

M-V

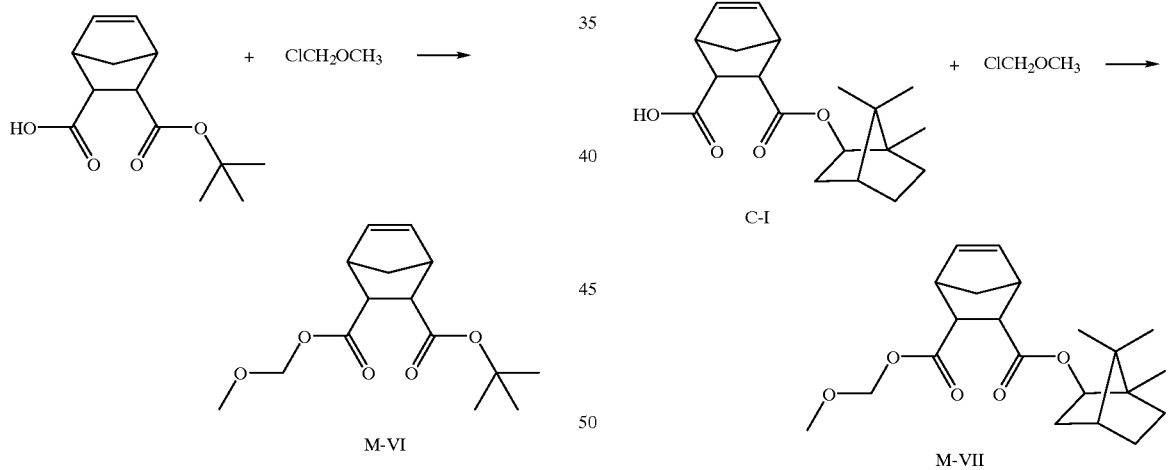

C-I

SYNTHESIS EXAMPLE VI 67 g of cis-5-norbornen-endo-2,3-dicarboxylic anhydride and 50 g of diphenylaminopyridine were dissolved in 154 ml of t-butanol and stirred for 15 hours at 80° C. After being neutralized with excess 5% aqueous HCl solution, the reaction mixture was extracted with ethyl acetate and dried over magnesium sulfate. Vacuum distillation was done to completely remove the solvent, producing 91 g of bicyclo[2,2,1]-5-hepten-2,3-dicarboxylic acid mono-t-butyl ester.

Thereafter, the procedure of the Synthesis Example IV was repeated using 52 g of bicyclo[2,2,1]-5-hepten-2,3-dicarboxylic acid mono-t-butyl ester, instead of 30 g of norbornene carboxylic acid, to give 51 g of the monomer represented by the following structural formula M-VI.

In dimethyl acetamide was dissolved 25.5 g of the compound (C-I) and to this was added 7.7 g of chloromethyl methyl ether. After being cooled to 0° C., the solution was slowly added with 12.1 g of triethyl amine with stirring and, then, subjected to reaction by stirring for 1 hour at the same temperature. The reaction was diluted in ethyl ether and washed with an aqueous $Na_2CO_3$ solution and water. The organic layer formed was isolated, dried over magnesium sulfate, and filtered to allow 25.2 g of the monomer represented by the following structural formula M-VII.

SYNTHESIS EXAMPLE VII 50 g of 5-norbornen-2,3-dicarboxyl anhydride and 47 g of isoborneol were dissolved in dimethyl acetamide and reacted at 80° C. for 15 hours in the presence of 44 g of 4-dimethylaminopyridine while stirring. After completion of the reaction, the solution was cooled to room temperature and neutralized with conc. hydrochloric acid. This neutralized reaction was diluted in ethyl ether and washed three times with distilled water. The organic layer obtained was dried over magnesium sulfate and filtered to give 65 g of the compound represented by the following structural formula C-I.

SYNTHESIS EXAMPLE VIII

From the compound C-1, synthesized in Synthesis Example VII, 30.5 g of the monomer represented by the following structural formula M-VIII were prepared in the same manner as that of Synthesis Example VII, except that, instead of 7.7 g of chloromethyl methyl ether, 12.7 g of 2-(chloromethoxymethyl)bicyclo[2,2,1]heptane were used.

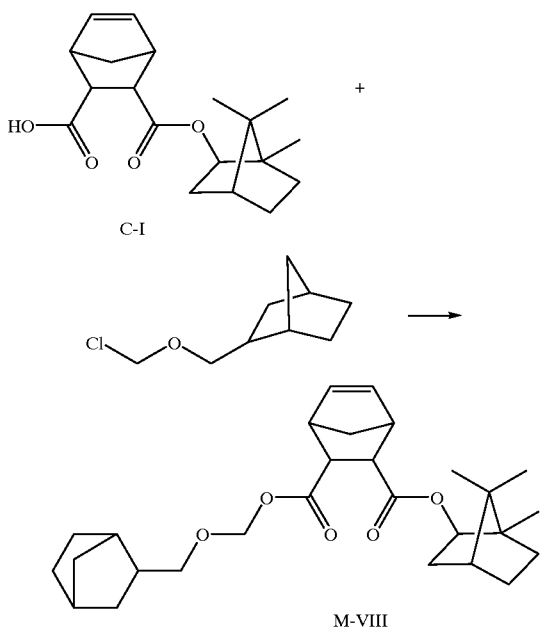

C-I

M-VIII

SYNTHESIS EXAMPLE IX 5-norbornen-2,3-dicarboxylic acid was reacted in the same manner as that of Synthesis Example VII, except for, instead of 47 g of isoborneol, 37.9 g of 2-norbornane methanol were used, to give 64.4 g of the compound represented by the following structural formula C-II.

From 23.2 g of this synthesized compound C-II, 20.7 g of the monomer M-IX, represented by the following formula M-IX, were obtained in the same manner as that of Synthesis Example VII.

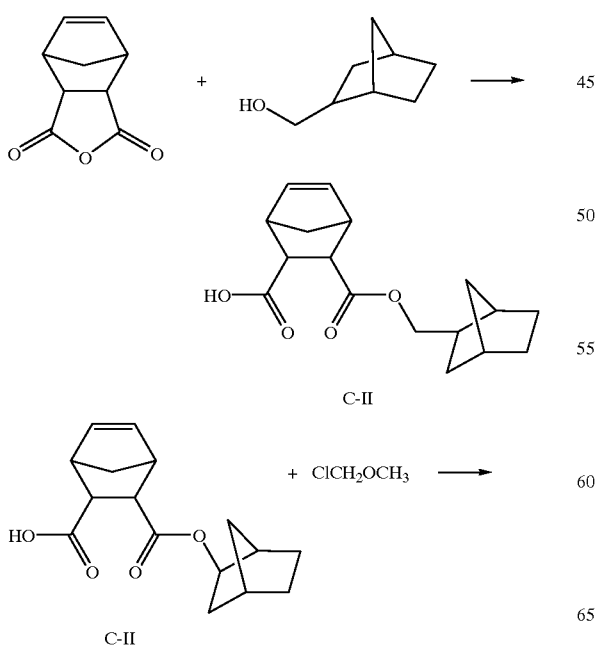

C-II

+ ClCH$_2$OCH$_3$ ⟶

C-II

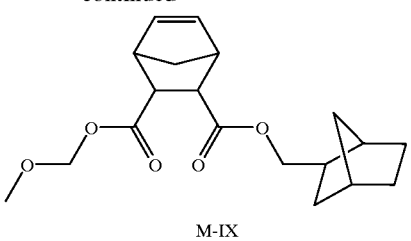

M-IX

SYNTHESIS EXAMPLE X

From 26.8 g of the compound C-II synthesized in Synthesis Example IX, 26.2 g of the monomer represented by the following structural formula M-X were obtained in the same manner as that of Synthesis Example IX, except for, instead of 7.7 g of chloromethyl methyl ether, were used 12.7 g of 2-(chloromethoxymethyl)bicyclo[2,2,1]heptane.

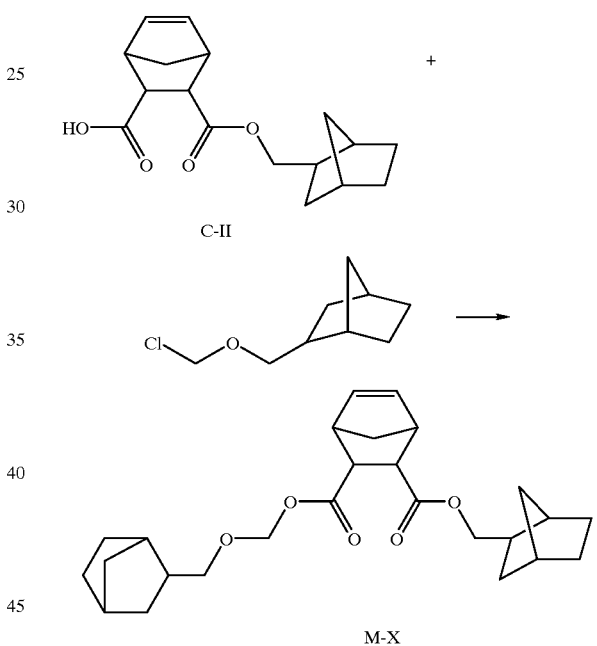

C-II

M-X

SYNTHESIS OF POLYMERS

POLYMERIZATION EXAMPLE I

In a two-necked, round-bottomed flask equipped with a stirrer and a reflux condenser, 2.38 g of the monomer M-I synthesized in Synthesis Example I, 5.61 g of the monomer M-II synthesized in Synthesis Example II, 4.90 g of maleic anhydride, and 1.88 g of norbornene were charged, together with 29.55 g of toluene and 0.82 g of AIBN. Under an argon atmosphere, the solution was well mixed by stirring for 2 hours at room temperature. Polymerization was initiated by activating the initiator at 70° C. At 20 hours after the polymerization, the reaction was cooled to room temperature. This polymerized solution was diluted with tetrahydrofuran and added to excess methanol/distilled water (4:1) to give precipitates. They were filtered and the filtrate was washed several times with the same mixed solvent and dried in vacuo to yield 10.34 g of the polymer represented by the following structural formula P1. It had a polystyrene-reduced weight average molecular weight of about 7,100.

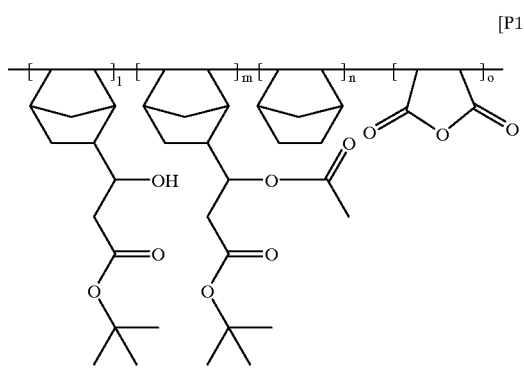

[P1]

POLYMERIZATION EXAMPLE II

The procedure of Polymerization Example I was repeated using 3.57 g of the monomer M-I, 5.23 g of the monomer M-III synthesized in Synthesis Example III, 4.90 g of maleic anhydride, 1.88 g of norbornene, together with 0.82 g of AIBN as a polymerization initiator and 31.18 g of toluene as a solvent, to allow 9.66 g of the polymer represented by the following structural formula P2. This polymer was 6,200 in polystyrene-reduced weight average molecular weight.

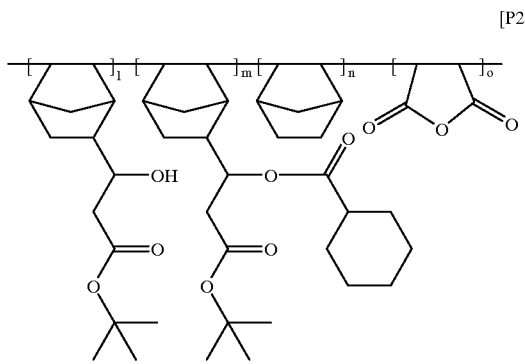

[P2]

POLYMERIZATION EXAMPLE III

Polymerization was carried out in a similar manner to that of Polymerization Example I, using 4.77 g of the monomer M-I, 1.82 g of the monomer M-IV synthesized in Synthesis Example IV, 4.90 g of maleic anhydride and 1.88 g of norbornene together with 0.82 g of AIBN and 26.75 g of toluene, to allow 9.09 g of the polymer represented by the following structural formula P3. This polymer was 6,600 in polystyrene-reduced weight average molecular weight.

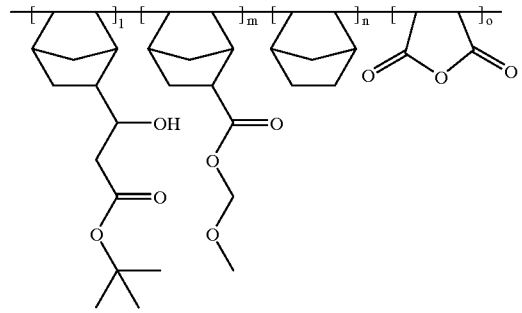

[P3]

POLYMERIZATION EXAMPLE IV 4.77 g of the monomer M-I, 1.96 g of the monomer M-V synthesized in Synthesis Example V, 4.90 g of maleic anhydride and 1.88 g of norbornene were polymerized in the presence of 0.82 g of AIBN in 27.03 g of toluene in a similar manner to that of Polymerization Example I, to allow 9.46 g of the polymer represented by the following structural formula P4, with a polystyrene-reduced weight average molecular weight of polymer represented by the following structural formula P4, with a polystyrene-reduced weight average molecular weight of 6,500.

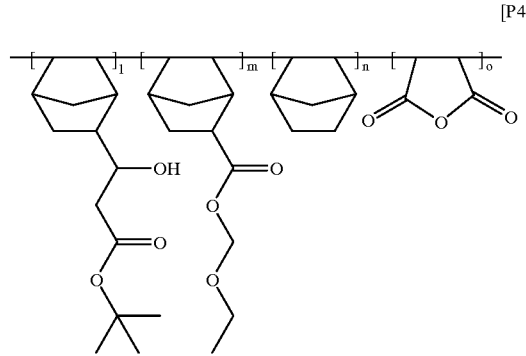

[P4]

POLYMERIZATION EXAMPLE V 2.38 g of the monomer M-I, 5.65 g of the monomer M-VI synthesized in Synthesis Example VI, 4.90 g of maleic anhydride and 1.88 g of norbornene were polymerized in the presence of 0.82 g of AIBN in 29.63 g of toluene in a similar manner to that of Polymerization Example I, to allow 9.77 g of the polymer represented by the following structural formula P5, with a polystyrene-reduced weight average molecular weight of 5,800.

[P5]

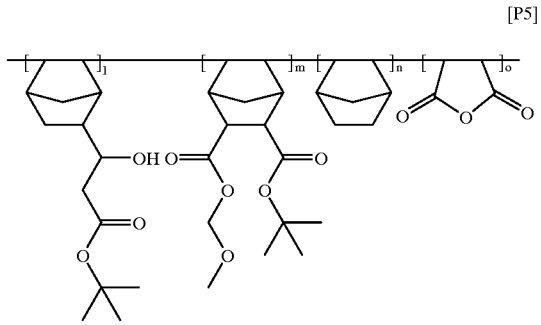

POLYMERIZATION EXAMPLE VI

In a two-necked, round-bottomed flask equipped with a stirrer and a reflux condenser, 4.77 g of the monomer M-I synthesized in Synthesis Example I, 5.44 g of the monomer M-VII synthesized in Synthesis Example VII, 4.90 g of maleic anhydride, and 1.41 g of norbornene were charged, together with 0.49 of AIBN as a polymerization initiator and 33.04 g of ethyl acetate as a reaction solution. Under an argon atmosphere, the solution was well mixed by stirring for 2 hours at room temperature. While maintaining the reaction temperature at 65° C., polymerization was carried out for 20 hours. After completion of the polymerization, the reaction was cooled to room temperature. This polymerized solution was diluted with tetrahydrofuran and added in excess isopropyl alcohol, to give precipitates. They were filtered and the filtrate was washed several times with the same mixed solvent and dried in vacuo to yield 11.06 g of the polymer represented by the following structural formula P6. It had a polystyrene-reduced weight average molecular weight of about 6,800.

[P6]

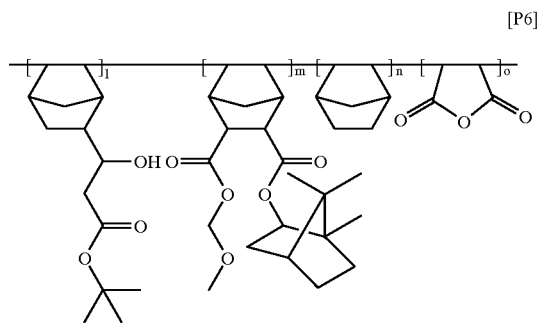

POLYMERIZATION EXAMPLE VII 4.77 g of the monomer M-I, 9.13 g of the monomer M-VIII synthesized in Synthesis Example VIII, 4.90 g of maleic anhydride and 0.94 g of norbornene were polymerized in the presence of 0.49 g of AIBN in 39.49 g of ethyl acetate in a similar manner to that of Polymerization Example VI, to allow 12.24 g of the polymer represented by the following structural formula P7, with a polystyrene-reduced weight average molecular weight of 5,700.

[P7]

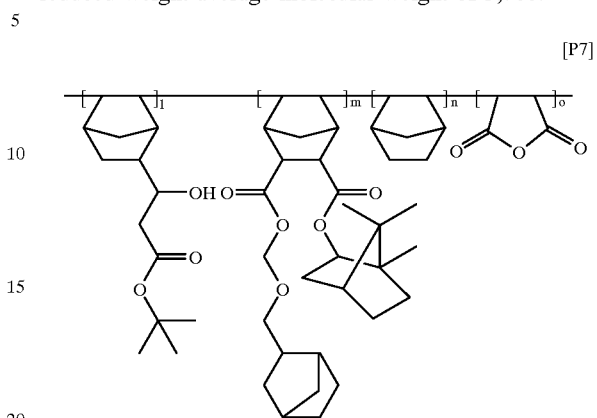

POLYMERIZATION EXAMPLE VIII 4.77 g of the monomer M-I, 5.02 g of the monomer M-IX synthesized in Synthesis Example IX, 4.90 g of maleic anhydride and 1.414 g of norbornene were polymerized in the presence of 0.49 g of AIBN in 32.20 of ethyl acetate in a similar manner to that of Polymerization Example VI, to allow 10.95 g of the polymer represented by the following structural formula P8, with a polystyrene-reduced weight average molecular weight of 7,400.

[P8]

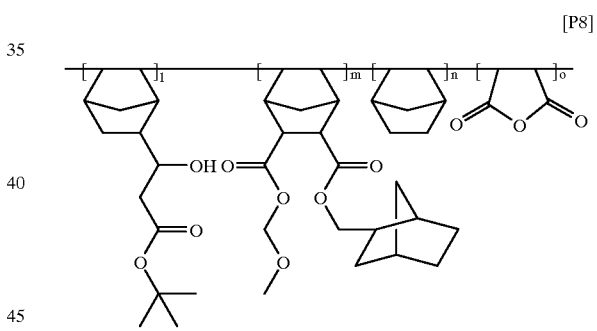

POLYMERIZATION EXAMPLE IX 4.77 g of the monomer M-I, 8.57 g of the monomer M-X synthesized in Synthesis Example X, 4.90 g of maleic anhydride and 0.94 g of norbornene were polymerized in the presence of 0.49 g of AIBN in 38.36 g of ethyl acetate by following the process shown in Polymerization Example VI, to allow 12.08 g of the polymer represented by the following structural formula P9, which was 6,200 in polystyrene-reduced weight average molecular weight.

[P9]
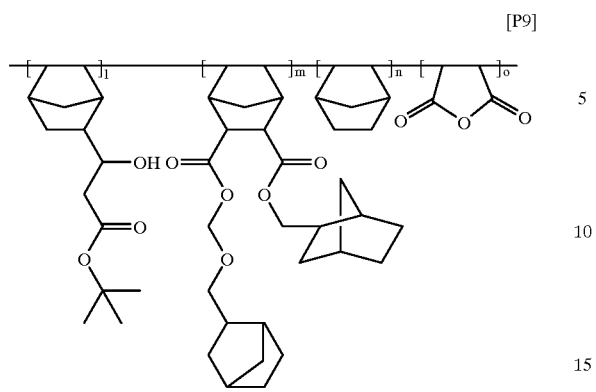

POLYMERIZATION EXAMPLE X

The same procedure as in Polymerization Example I was repeated using 7.15 g of the monomer M-I, 1.88 g of maleic anhydride and 4.90 g of norbornene along with 0.82 g of AIBN and 27.87 g of toluene. In result, the polymer represented by the following formula P10 was obtained at an amount of 8.36 g, which was measured to be 6,400 in polystyrene-reduced weight average molecular weight.

[P10]
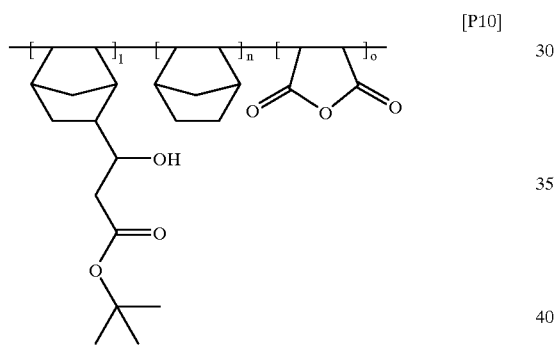

POLYMERIZATION EXAMPLE XI

The same procedure as in Polymerization Example I was repeated using 4.77 g of the monomer M-I, 8.41 g of the monomer M-II synthesized in Synthesis Example II, and 4.90 g of maleic anhydride along with 0.82 g of AIBN and 36.16 g of toluene. In result, the polymer represented by the following formula P11 was obtained at an amount of 11.57 g, which was measured to be 6,500 in polystyrene-reduced weight average molecular weight.

[P11]
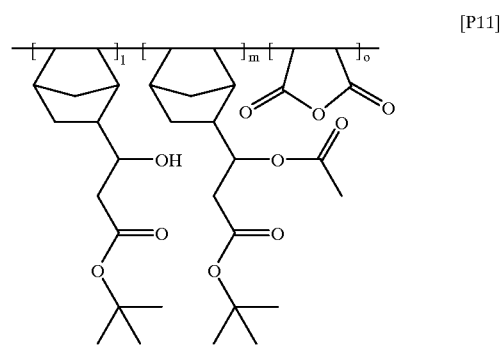

POLYMERIZATION EXAMPLE XII

The same procedure as in Polymerization Example I was repeated using 3.57 g of the monomer M-I, 12.20 g of the monomer M-III synthesized in Synthesis Example III, and 4.90 g of maleic anhydride along with 0.82 g of AIBN and 41.35 g of toluene. As a result, the polymer represented by the following formula P12 was obtained at an amount of 12.82 g, which was measured to be 6,000 in polystyrene-reduced weight average molecular weight.

[P12]
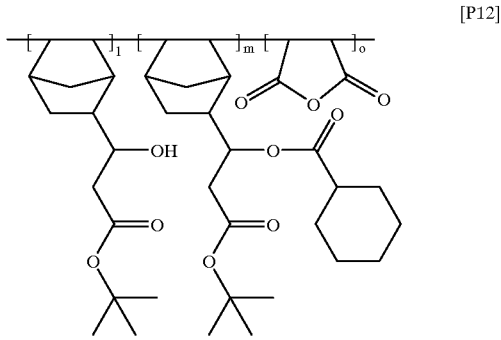

POLYMERIZATION EXAMPLE XIII

The same procedure as in Polymerization Example VI was repeated using 5.96 g of the monomer M-I, 7.06 g of the monomer M-VI synthesized in Synthesis Example VI, and 4.90 g of maleic anhydride along with 0.49 g of AIBN and 35.84 g of ethyl acetate. As a result, the polymer represented by the following formula P13 was obtained at an amount of 11.29 g, which was measured to be 7,100 in polystyrene-reduced weight average molecular weight.

[P13]

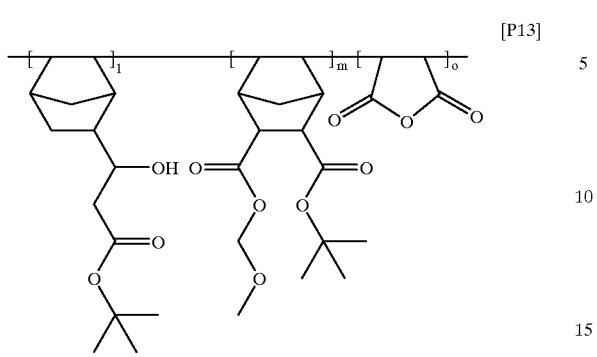

[P15]

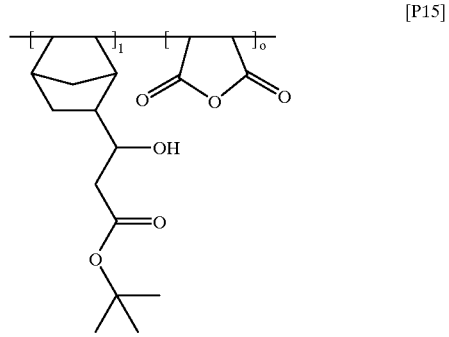

RESIST FORMULATION AND ASSAY

EXAMPLE I 100 weight parts of the resin P1 obtained in Polymerization Example I were dissolved, along with 1.6 weight parts of diphenyl(4-methylphenyl)sulfonium triflate and 0.04 weight parts of methyl ammonium hydroxide, in 500 weight parts of propyleneglycol methyl ether acetate (PGMEA) and the solution was filtered through a 0.2 μm membrane.

The resist solution thus obtained was coated on a substrate by use of a spinner and dried at 110° C. for 90 sec, to form a coating 0.6 μm thick. This coating was exposed to light in an ArF excimer laser steper while the diphenyl(4-methylphenyl)sulfonium triflate and the methyl ammonium hydroxide served as a photoacid generator and an acid diffusion preventer, respectively, and then, baked at 130° C. for 90 sec. Subsequently, the exposed coating was immersed in an aqueous 2.38 wt % tetramethylammonium hydroxide solution for 60 sec for development, washed and dried to form a resist pattern.

With a sensitivity of 21 mJ/cm$^2$, the resist pattern was found to be good in adherence to substrate and show a resolution of 0.15 μm.

The 0.2 μm line-and-space (L/S) pattern formed after the development, was observed with a scanning electron microscope to examine its adherence to substrate. If bad conditions, such as released or loose states, were found, the adherence to substrate was determined to be "poor"; if not found, the adherence to substrate was determined to be "good".

As far as sensitivity, when there was formed the 0.2 μm line-and-space (L/S) pattern in which the lines had an equal width, the exposure energy used was an optimal energy and was regarded as the sensitivity for the pattern. Also, a pattern dimension at which the pattern could be resolved as minimally as possible under the optimal energy, was defined as the resolution for the pattern.

EXAMPLES II TO IX

The resins obtained in Polymerization Examples II to IX were dissolved in a solvent, along with a photoacid generator and a base additive, and filtered through 0.2 μm membranes to produce resist compositions, as indicated in Table 1, below.

Using an ArF excimer laser steper (lens numerical aperture 0.60), these resist compositions were formed into posi-

POLYMERIZATION EXAMPLE XIV

In 39.40 g of ethyl acetate, 4.77 g of the monomer M-I, 10.03 g of the monomer M-IX synthesized in Synthesis Example IX and 4.90 g of maleic anhydride were polymerized with the aid of 0.49 g of AIBN in 39.40 g of ethyl acetate in the same manner as in Polymerization Example VI, to allow 11.82 g of the polymer represented by the following structural formula P14. It was measured to have a polystyrene-reduced weight average molecular weight of about 6,900.

[P14]

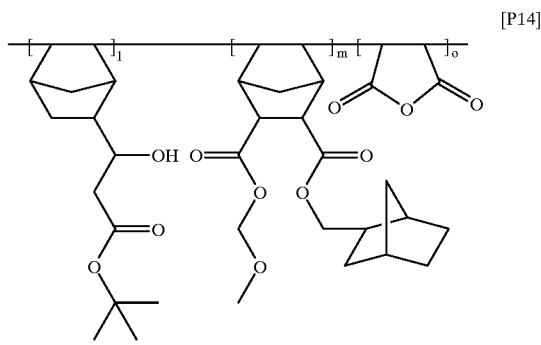

POLYMERIZATION EXAMPLE XV

In 33.64 g of ethyl acetate, 11.92 g of the monomer M-I and 4.90 g of maleic anhydride were polymerized with the aid of 0.49 g of AIBN in 33.64 g of ethyl acetate in the same manner as in Polymerization Example VI, to allow 9.42 g of the polymer represented by the following structural formula P15. It was measured to have a polystyrene-reduced weight average molecular weight of about 7,000.

tive resist patterns which were tested as in Example I. The test results are given in Table 1, below.

TABLE 1

| No. of Exmp. | Composition (wt. parts) | | | | Properties | | | |
|---|---|---|---|---|---|---|---|---|
| | Resin | ¹PAG | ²Base | ³Solvent | Adher. to Sub. | Sensitiv. (mJ/cm²) | Develop ability | Resol'n (μm) |
| II | P2(100) | 1.4 | 0.03 | 460 | good | 16 | good | 0.13 |
| III | P3(100) | 1.4 | 0.03 | 480 | good | 15 | good | 0.13 |
| IV | P4(100) | 1.4 | 0.03 | 480 | good | 1 | good | 0.14 |
| V | P5(100) | 1.4 | 0.03 | 460 | good | 14 | good | 0.14 |
| VI | P6(100) | 1.6 | 0.04 | 480 | good | 16 | good | 0.13 |
| VII | P7(100) | 1.6 | 0.04 | 460 | good | 17 | good | 0.14 |
| VIII | P8(100) | 1.6 | 0.04 | 500 | good | 16 | good | 0.13 |
| IX | P9(100) | 1.6 | 0.04 | 460 | good | 19 | good | 0.14 |

¹Photoacid generator: diphenyl(4-methylphenyl)sulfonium triflate.
²Base additive: methyl ammonium hydroxide.
³Solvent: propylene glycol methyl ether acetate (PGMEA).

Observation was also done to examine the heat deformation of the resist patterns after they were heated at 110° C. on a hot plate, leading to the conclusion that nowhere were found deformed patterns and their thermal resistance was superior.

EXAMPLE X TO XV

Positive resist patterns were formed from the compositions indicated in Table 2, below, in the same manner as in Example I, and assayed for various properties. The results are also given in Table 2.

TABLE 2

| No. of Exmp. | Composition (wt. parts) | | | | Properties | | | |
|---|---|---|---|---|---|---|---|---|
| | Resin | ¹PAG | ²Base | ³Solvent | Adher. to Sub. | Sensitiv. (mJ/cm²) | Develop ability | Resol'n (μm) |
| X | P10(100) | 1.6 | 0.04 | 480 | good | 24 | good | 0.14 |
| XI | P11(100) | 1.6 | 0.04 | 460 | good | 21 | good | 0.13 |
| XII | P12(100) | 1.6 | 0.04 | 460 | good | 23 | good | 0.13 |
| XIII | P13(100) | 1.6 | 0.04 | 500 | good | 25 | good | 0.14 |
| VX | P14(100) | 1.6 | 0.04 | 500 | good | 24 | good | 0.14 |
| XV | P15(100) | 1.6 | 0.04 | 500 | good | 26 | good | 0.15 |

¹Photoacid generator: diphenyl(4-methylphenyl)sulfonium triflate.
²Base additive: methyl ammonium hydroxide.
³Solvent: propylene glycol methyl ether acetate (PGMEA).

EXAMPLES XVI TO XXIII

The resins, P2, P8, and P10 to P14, were dissolved, singly or in combinations, in a solvent, along with photoacid generators and base additives, and filtered through 0.2 μm membranes to produce resist compositions, as indicated in Table 3, below.

Using an ArF excimer laser steper (lens numerical aperture 0.60), these resist compositions were formed into positive resist patterns which were tested as in Example I. The test results are given in Table 3, below.

TABLE 3

| No. of Exmp. | Composition (wt. parts) | | | | Properties | | | |
|---|---|---|---|---|---|---|---|---|
| | Resin | ¹PAG | ²Base | ³Solvent | Adher. to Sub. | Sensitiv. (mJ/cm²) | Develop ability | Resol'n (μm) |
| XVI | P2(100) | A1/A2 (1.4/0.4) | B1 (0.05) | 500 | good | 18 | good | 0.13 |
| XVII | P2 (100) | A1 (1.6) | B1/B2 (0.05) | 500 | good | 12 | good | 0.14 |

TABLE 3-continued

| No. of Exmp. | Composition (wt. parts) | | | | Properties | | | |
|---|---|---|---|---|---|---|---|---|
| | Resin | ¹PAG | ²Base | ³Solvent | Adher. to Sub. | Sensitiv. (mJ/cm²) | Develop ability | Resol'n (μm) |
| XVIII | P8 (100) | A1/A2 (1.4/0.4) | B1 (0.05) | 500 | good | 16 | good | 0.13 |
| XIX | P8 (100) | A1 (1.6) | B1/B2 (0.05) | 500 | good | 13 | good | 0.14 |
| XX | P11/P10 (50/50) | A1 (1.6) | B1 (0.05) | 460 | good | 18 | good | 0.13 |
| XXI | P12/P10 (50/50) | A1 (1.6) | B1 (0.05) | 460 | good | 21 | good | 0.13 |
| XXII | P13/P10 (50/50) | A1 (1.6) | B1 (0.05) | 480 | good | 23 | good | 0.13 |
| XXIII | P14/P10 (50/50) | A1 (1.6) | B1 (0.05) | 480 | good | 22 | good | 0.13 |

¹Photoacid generator: $A_1$, diphenyl(4-methylphenyl)sulfonium triflate; $A_2$, phenyl (4-methoxyphenyl)iodonium triflate.
²Base additive: $B_1$, methyl ammonium hydroxide; $B_2$, tributyl amine.
³Solvent: propylene glycol methyl ether acetate(PGMEA).

Observation was also done to examine the heat deformation of the resist patterns after they were heated at 110° C. on a hot plate, leading to the conclusion that nowhere were found deformed patterns and their thermal resistance was superior.

As described hereinbefore, the chemical amplification resist compositions according to the present invention can be easily controlled in sensitivity by regulating the content and kind of the norbornene derivatives in the matrix polymers in addition to being superior in adherence to substrate and dry etch resistance. With these advantages, the chemical amplification resist compositions can be formed into resist patterns much improved in transparency, photosensitivity and resolution. Consequently, the chemical amplification resist compositions of the present invention can be so useful in fabricating semiconductor devices, which are expected to be further miniaturized. Particularly, the resist compositions are suitable to KrF and ArF excimer lasers, enabling a submicrolithography process to be as exquisite as 0.2 μm or less.

Although the invention has been described in detail by referring to certain preferred embodiments, it will be understood that various modifications can be made within the spirit and scope of the invention. The invention is not to be limited except as set forth in the following claims.

What is claimed is:

1. A copolymer, represented by the following general formula I:

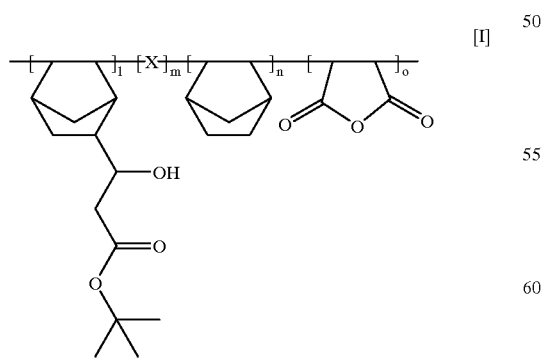

[I]

wherein,

X is selected from the group consisting of the following general formulas II, III and IV:

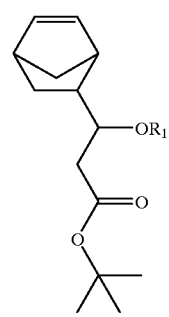

[II]

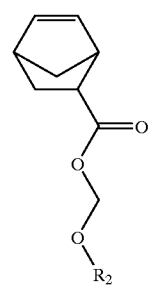

[III]

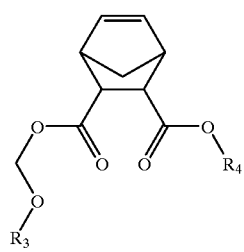

[IV]

wherein $R_1$ is selected from the group consisting of straight or branched alkyl groups, cyclic or polycyclic alkyl groups, alkyl carbonyl groups, branched alkyl carbonyl groups, and cyclic or polycyclic alkyl carbonyl groups, all containing 1–10 carbon atoms; $R_2$, $R_3$ and $R_4$ are independently selected from the group consisting of straight or branched alkyl groups, and cyclic or polycyclic alkyl groups, all containing 1–10 carbon atoms; and l, m, n and o each are a repeating number not more than 0.5, satisfying the condition that l+m+n+o=1 and 0.4≦o≦0.5.

2. A copolymer as set forth in claim 1, wherein l and m each range from 0 to 0.5 with 0.15≦l+m≦0.5 and n ranges from 0 to 0.35.

3. A chemical amplification resist composition, comprising;

a copolymer represented by the following general formula I:

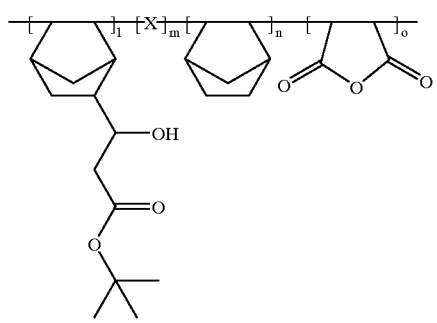

[I]

wherein,

X is selected from the group consisting of the following general formulas II, III and IV:

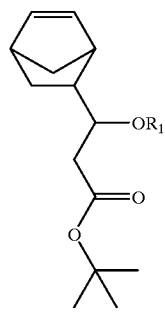

[II]

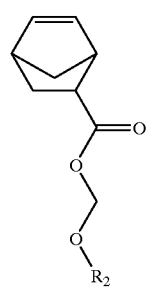

[III]

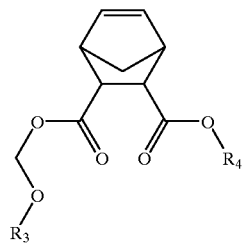

[IV]

wherein R₁ is selected from the group consisting of straight or branched alkyl groups, cyclic or polycyclic alkyl groups, alkyl carbonyl groups, branched alkyl carbonyl groups, and cyclic or polycyclic alkyl carbonyl groups, all containing 1–10 carbon atoms;

R₂, R₃ and R₄ are independently selected from the group consisting of straight or branched alkyl groups, and cyclic or polycyclic alkyl groups, all containing 1–10 carbon atoms; and l, m, n and o each are a repeating number not more than 0.5, satisfying the condition that l+m+n+o=1 and 0.4≦o≦0.5;

a photoacid generator; and a solvent.

4. A chemical amplification resist composition as set forth in claim 3, wherein the photoacid generator is at least one selected from the group consisting of onium salts comprising triphenylsulfonium triflate, triphenylsulfonium hexafluoroantimonate, diphenyliodonium triflate, diphenyliodonium methyl benzene sulfonate, and the compounds represented from the following formulas XI and XII:

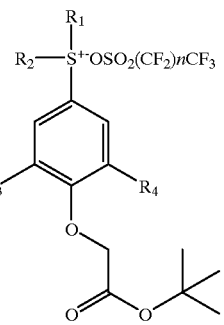

[XI]

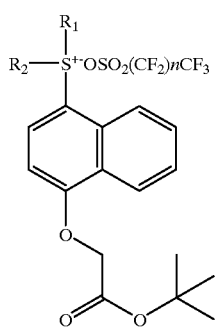

[XII]

wherein R₁ and R₂, which may be the same or different, each represents an alkyl, an allyl or an aryl; R₃ and R₄, which may be the same or different, each represents a hydrogen atom, an alkyl or an alkoxy; and n is an integer of 0–14; halogen compounds comprising 1,1-bis(4-chlorophenyl)-2,2,2-trichloroethane, phenyl-bis(trichloromethyl)-triazine and naphthyl-bis(trichloromethyl)-triazine; diazoketone compounds comprising 1,3-diketo-2-diazo compounds, diazobenzoquinone compounds and diazonaphthoquinone compounds; sulfone compounds; sulfonic acid compounds; and nitrobenzyl compounds.

5. A chemical amplification resist composition as set forth in claim 3, wherein the photoacid generator is used at an amount of approximately 0.3–10 weight parts based on 100 weight parts of the copolymer and the base additive is used at an amount of approximately 0–50 weight parts based on the 100 weight parts of the photoacid generator.

* * * * *